United States Patent [19]
Laffitte et al.

[11] Patent Number: 4,589,099
[45] Date of Patent: May 13, 1986

[54] SOLID SLICE MEMORY

[75] Inventors: David S. Laffitte; William D. Hopkins, both of Houston; John W. Hayn, II, Sugarland, all of Tex.

[73] Assignee: Texas Instruments Incorporated, Dallas, Tex.

[21] Appl. No.: 450,830

[22] Filed: Dec. 20, 1982

[51] Int. Cl.$^4$ ............................................. G11C 7/00
[52] U.S. Cl. ................................... 365/230; 365/189
[58] Field of Search .............. 365/103, 104, 174, 189, 365/230

[56] References Cited

U.S. PATENT DOCUMENTS 4,472,792  9/1984  Shimohigashi et al. ............ 365/230

Primary Examiner—James W. Moffitt
Attorney, Agent, or Firm—Robert D. Marshall, Jr.; N. Rhys Merrett; Melvin Sharp

[57] ABSTRACT

An electronic system located upon a single semiconductor substrate including a plurality of isolated electronic subsystems located upon the semiconductor substrate. Each electronic subsystem includes a plurality of input-/output lines. Several information bus lines are included that are connected to addressable transistors located between the individual bus lines and the input/output lines. An addressing means is connected to the addressable transistors for addressing each of the addressable transistors and for providing a first state signal indicating an ON condition to the first select group of said addressable transistors, electrically connecting the information bus lines to the input/output lines and a second state signal indicating an OFF condition to a second selected group of the addressable transistors, electrically isolating the information bus lines from the input/output lines. The addressable transistors maintain the state signal indicated condition.

6 Claims, 4 Drawing Figures

SOLID SLICE MEMORY

BACKGROUND

1. Field of the Invention

This invention relates to electronic systems located upon a semiconductor substrate and more specifically to the addressable, electronic system located upon a single substrate.

2. Description of the Prior Art

The use of slices which are sections of round silicon to fabricate semiconductor integrated circuits has long been known and is used in the semiconductor industry. The slices are also called wafers and include several individual integrated circuits on a single wafer. It is part of the normal manufacturing process to dice the wafer and separate each of the individual integrated circuits contained on the wafer for packaging in dual in-line packages or flat packages as desired.

The object of this present invention is to provide an overall electronic system that includes the interconnection of the individual integrated circuits contained on the wafer. The prior art contains a similar type of system disclosed in U.S. Pat. No. 3,758,761, entiled "Self-Interconnecting/Self-Repairable Electronic Systems on a Slice" by W. S. Henrion and assigned to Texas Instruments Incorporated. The difference between the prior art and the present invention is that the present invention provides a programmable capability to select selected integrated circuits contained on the slice or wafer.

This selectivity is made possible by nonvolatile memory. Nonvolatile random access memories have been recently developed consisting of a CMOS RAM with a backup battery produced by Catalyst Research Corporation and called the Catalyst Research Lithium Iodine Cell. Other nonvolatile random access memory cells have been disclosed in *Electronics*, Sept. 22, 1981, in an article entitled, "4K RAM as Nonvolatile Backup Array", pp. 179, 180 and a technical article in *Electronics*, Oct. 11, 1979, entitled "5 Volt Only, Nonvolatile RAM Owes It All to Polysilicon", on pp. 111–116.

SUMMARY

In accordance with the present invention, an electronic system located upon a single semiconductor substrate is provide that includes several isolated electronic subsystems fabricated is integrated circuits upon the seniconductor substrate. Each of the electronic subsystem includes several input/output lines. Also included on the semiconductor substrate is an information bus that is connected to addressable transistors. These addressable transistors provide for the interconnection between the information bus and the input/output lines of the electronic subsytems. The addressable transistors provide the interconnection between the information bus and the input/output lines.

BRIEF DESCRIPTION OF THE DRAWINGS

The novel features believed characteristic of this invention are set forth in the appended claims. The invention itself, however, as well as other features and advantages thereof, will be best understood by reference to the detailed description which follows, read in conjunction with the accompanying drawings, wherein:

DESCRIPTION OF THE PREFERRED EMBODIMENT

Figure 1:
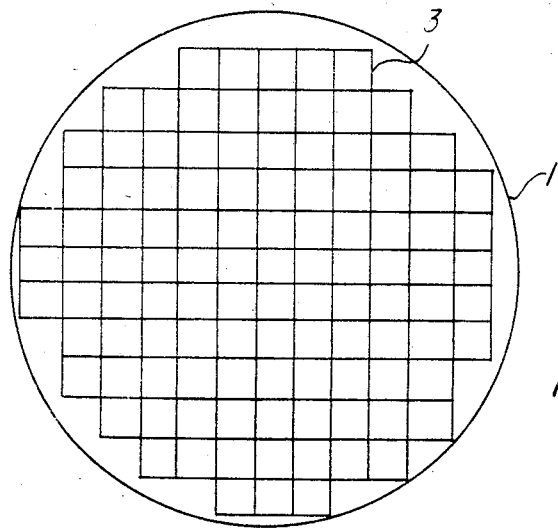
FIG. 1 is an illustration of semiconductor wafer.

FIG. 1 illustrates a typical wafer containing several integrated circuits labeled 3 on the semiconductor substrate 1. In the present invention, the wafer 1 contains several electronic subsystems fabricated as integrated circuits 3. However, these integrated circuits in the present invention are interconnected by an information bus.

Figure 2:
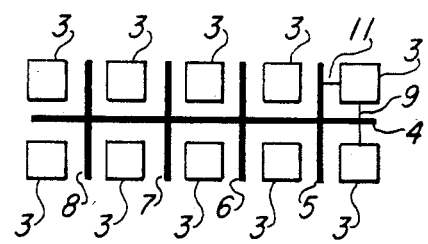
FIG. 2 is a block diagram showing the interconnection of the integrated circuits contained on a wafer of the invention.

FIG. 2 illustrates the interconnection of the individual integrated circuits illustrated as blocks 3. The information buses 4, and also 5, 6, 7 and 8 are independent but are interconnected to the integrated circuits by lines 9 and 11 as shown. The bus 4 preferably includes a data portion for communicating data and a control portion for communicating control information. The information buses are connected through addressable transistors that are turned on or off in accordance with the state of a nonvolatile RAM cell. The nonvolatile RAM cell is disclosed in U.S. Pat. No. 94,524,431 entitled "High-Speed Non-Volatile Memory Array", the interconnection of these information bus lines to the I/O lines is contained in the U.S. PAT. No. 3,758,761, entitled "Self-Connecting/Self-Repairable Electronic Systems on a Slice" herein incorporated by reference. Simply stated, the addressable transistors provide either a short or an open isolation between each of the input/output lines and the information bus. Each of these transistors is addressable and connected to a nonvolatile RAM cell. When the nonvolatile RAM cell is ON or contains a "1", the transistor attached is turned ON connecting the input/output line to the information bus line. When the RAM cell is "0" or OFF, the transistor is turned OFF, thus isolating the input/output line from the information bus line. By storing selected patterns in the nonvolatile random access memory, different integrated circuits contained on the wafer may be selected to be attached to the information bus line. The information bus line is then connected to an external digital processing system to provide a function such as additional external memory.

Figure 3:
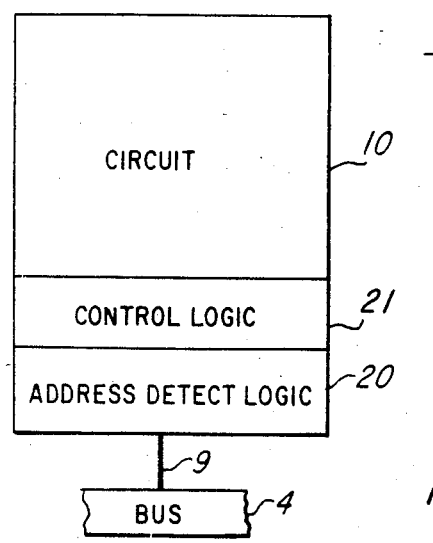
FIG. 3 is a diagram of the functional structure of an integrated circuit of FIG. 2.

FIG. 3 is a block diagram illustrating the contents of a single integrated circuit 3 of FIG. 2. This integrated circuit 3 includes circuit 10 which can perform a useful function and is connected to bus 4 via lines 9. While the number of lines 9 may be any number up to the number of lines in bus 4, this system could be implemented with a single line bus 4 and a single connection line 9. The integrated circuit 3 contains control logic 21 and address detection logic 20 to enable the integrated circuit 3 to connect itself actively to the bus 4.

Figure 4:
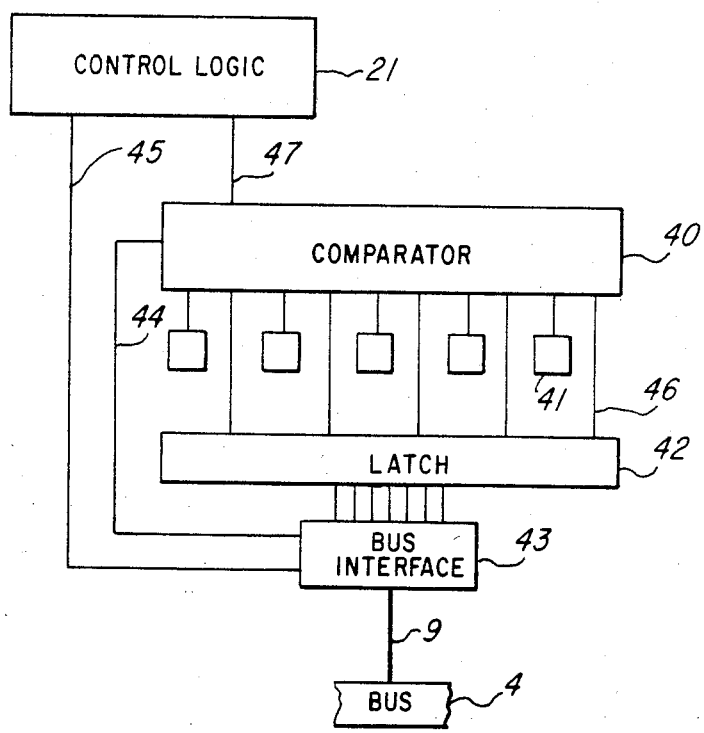
FIG. 4 is a detailed block diagram of the address detect logic together with the coupling to the control logic.

FIG. 4 illustrates the contents of the address detect logic 20. The comparator 40 is connected to address input lines 46 which are connected to a latch 42. The latch 42 acts as temporary storage of the bus 4 data input through the bus interface 43. The bus interface 43 also interfaces to the control portion of bus 4 and provides information directly to the control logic 21 via line 45 and a strobe to the comparator 40 via line 44.

The data to the control logic 21 enables the address of the integrated circuit 3 to be input into the nonvolatile memory cells such as 41. After the address has been established, the address detect logic 20 compares incoming addresses from the bus 4 via comparator 40 and when received address corresponds to the address stored in nonvolatile memory cells 41 provides an enable signal on line 47 to the control 94 logic 21 to interface the circuit 3 to the bus 4. If the integrated curcuit 10 contains memory cells, the high order bits of the address may be used to select the specific integrated circuit 3 on the slice and the least significant bits may be used to address the individual memory cells.

This architecture allows for power-up address assignments to be reinitialized enabling "bad" or faulty integrated circuits to be removed.

What is claimed is:

1. An electronic system located upon a single semiconductor substrate comprising:
   a plurality of isolated integrated circuits located upon said substrate, each integrated circuit having a plurality of input/output lines;
   an information bus connected to each integrated circuit via the corresponding input/output lines;
   address detection means included within each integrated circuit and connected to the input/output lines of that integrated circuit, said address detection means for the detecting when an integrated circuits address corresponding to said integrated circuit is present upon said information bus and providing an enable signal thereto, said address detection means further including nonvolatile read/write memory to store said integrated circuit address; and
   control circuit included within each integrated circuit connected to said address detection means to receive said enable signal and regulate the flow of information between the integrated circuit and the bus.

2. An electronic system located upon a single semiconductor substrate as claimed in claim 1, wherein:
   said control circuit further includes means responsive to said information bus for writing said integrated circuit address in said nonvolatile read/write memory.

3. An electronic system located upon a single semiconductor substrate as claimed in claim 1, wherein said address detection means further includes:
   a latch circuit for storing the state of said information bus;
   a bus interface connected to said input/output lines and said latch circuit for receiving the signals on said input/output lines, connecting said input/output lines to said latch circuit thereby storing the state of said information bus therein and generating an strobe signal; and
   a comparator connected to said nonvolatile read/write memory, said control circuit, said latch circuit and receiving said strobe signal from said bus interface for comparing the state of said nonvolatile read/write memory with the state of said latch circuit upon receiving said strobe signals and generating said enable signal when the state of said latch circuit matches the state of said nonvolatile read/write memory.

4. An electronic system located upon a single semiconductor substrate as claimed in claim 3, wherein:
   said information bus includes a set of data lines and a set of control lines;
   said input/output lines of each integrated circuit includes a first set of lines connected to said data lines and a second set of lines connected to said control lines;
   said bus interface connects said first set of input/output lines to said latch circuit and further connects said second set of input/output lines directly to said control circuit; and
   said control circuit further includes means responsive to said control lines of said information bus to regulate the flow of information between said integrated circuit and data lines of said information bus.

5. An electronic system located upon a single semiconductor substrate comprising:
   a plurality of isolated integrated circuits located upon said substrate, each integrated circuit having a plurality of input/output lines;
   an information bus connected to each integrated circuit via the corresponding input/output lines;
   an address detection means included within each integrated circuit and connected to the input/output lines of that integrated circuit, said address detection means for detecting when an integrated circuit address corresponding to that integrated circuit in present on said information bus and providing an enable signal thereto, said address detection means including a nonvolatile read/write memory to store said integrated circuit address;
   a memory array included within each integrated circuit having a plurality of addressable read/write memory cells; and
   a control circuit included within each integrated circuit connected to said address detection means and said memory array for controlling transfer of data between said information bus and said memory array in response to said enable signal.

6. An electronic system located upon a single semiconductor substrate as claimed in claim 5, wherein:
   said information bus includes a set of high order bits which designate a particular integrated circuit and a set of low order bits which designate a particular memory address;
   said nonvolatile read/write memory of each integrated circuit stores said integrated circuit address equal to the particular state of said high order bits of said information bus designating that integrated circuit;
   said address detection means generates said enable signal when said high order bits of said information bus corresponds to the particular state stored in said nonvolatile read/write memory means; and
   said control means enables transfer of data between said information bus and said addressable memory cell corresponding to said low order bits of said information bus upon receipt of said enable signal.

* * * * *